United States Patent [19]

Yoshida

[11] Patent Number: 5,599,724
[45] Date of Patent: Feb. 4, 1997

[54] FET HAVING PART OF ACTIVE REGION FORMED IN SEMICONDUCTOR LAYER IN THROUGH HOLE FORMED IN GATE ELECTRODE AND METHOD FOR MANUFACTURING THE SAME

[75] Inventor: Takeshi Yoshida, Yokohama, Japan

[73] Assignee: Kabushiki Kaisha Toshiba, Tokyo, Japan

[21] Appl. No.: 518,855

[22] Filed: Aug. 24, 1995

Related U.S. Application Data

[62] Division of Ser. No. 310,814, Sep. 22, 1994, abandoned, which is a continuation of Ser. No. 65,138, May 20, 1993, abandoned.

[30] Foreign Application Priority Data

May 21, 1992 [JP] Japan .................................. 4-128959

[51] Int. Cl.$^6$ ...................... H01L 21/265; H01L 21/225; H01L 21/385
[52] U.S. Cl. ............................. 437/40; 437/41; 437/162; 437/911
[58] Field of Search .................................. 437/911, 162, 437/165, 166, 203, 40 JF, 41 JF, 41 CS; 148/DIG. 88; 257/256, 263, 264, 265, 266, 272, 273

[56] References Cited

U.S. PATENT DOCUMENTS

| | | | |
|---|---|---|---|
| 4,404,575 | 9/1983 | Nishizawa | 257/264 |
| 4,434,433 | 2/1984 | Nishizawa | 257/264 |
| 4,566,172 | 1/1986 | Bencuya et al. | 257/264 |
| 5,252,849 | 10/1993 | Fitch et al. | 257/329 |
| 5,414,289 | 5/1995 | Fitch et al. | 257/329 |

FOREIGN PATENT DOCUMENTS

| | | | |
|---|---|---|---|
| 52-22480 | 2/1977 | Japan | 257/404 |
| 55-87481 | 7/1980 | Japan | 257/403 |
| 60-189962 | 9/1985 | Japan | 257/329 |
| 3-55888 A | 3/1991 | Japan | 437/911 |

OTHER PUBLICATIONS

IBM Technical Disclosure Bulletin, vol. 11 No. 3, Aug. 1968, pp. 332–333, "High–Speed Field–Effect Transistor", by Drangeid.

*Primary Examiner*—Mary Wilczewski
*Assistant Examiner*—Brian K. Dutton
*Attorney, Agent, or Firm*—Loeb & Loeb LLP

[57] ABSTRACT

An N-type source (or drain) region is formed in the surface area of a P-type silicon substrate. A first insulation film is formed on the silicon substrate and a gate electrode is formed on the first insulation film. A second insulation film is formed on the first insulation film and gate electrode. A through hole is formed in those portions of the second insulation film, gate electrode and first insulation film which lie on the source region. A gate oxide film is formed on the side wall of the through hole. A P-type silicon layer serving as a channel region is formed on that portion of the source region which lies inside the through hole by the selective epitaxial growth. An N-type drain (or source) region is formed in the upper portion of the silicon layer. A third insulation film is formed on the resultant structure. A first contact hole is formed in portions of the third, second and first insulation films which lie on the source region, a second contact hole is formed in portions of the third and second insulation films which lie on the gate electrode, and a third contact hole is formed in a portion of the third insulation film which lies on the drain region by use of the RIE method. Wiring layers are formed inside the first to third contact holes and on part of the third insulation film.

20 Claims, 8 Drawing Sheets

FET HAVING PART OF ACTIVE REGION FORMED IN SEMICONDUCTOR LAYER IN THROUGH HOLE FORMED IN GATE ELECTRODE AND METHOD FOR MANUFACTURING THE SAME

This is a divisional of application Ser. No. 08/310,814 filed Sep. 22, 1994, now abandoned, which is a continuation of application Ser. No. 08/065,138 filed May 20, 1993, now abandoned.

BACKGROUND OF THE INVENTION

1. Field of the Invention

This invention relates to a semiconductor device and a method for manufacturing the same, and more particularly to a field effect transistor (FET) having part of an active region formed in a semiconductor layer which lies in a through hole formed in a gate electrode and a method for manufacturing the same.

2. Description of the Related Art

Generally, in an FET such as a MOS (Metal-Oxide-Semiconductor) FET, MIS (Metal-Insulator-Semiconductor) FET or MES (Metal-Semiconductor) FET, active regions such as source and drain regions and channel region are formed in a semiconductor substrate. Therefore, the occupied area of the FET in the semiconductor substrate is determined by the total area of the active regions.

Most of the semiconductor integrated circuit devices such as LSIs are constructed with FETs such as MOSFETs, MISFETs or MESFETs as amplifying elements. Therefore, in order to raise the integration density of the semiconductor integrated circuit device, it is necessary to reduce the size of the FET which is a main constituent of the device.

However, the integration density required for the semiconductor integrated circuit device is getting higher. So the size of the FET for satisfying the above requirement approaches the minimum size which is needed for acting as an amplifying element. Even in this situation, it is further required for the FET to have high performance such as high-speed switching operation in order to raise up the operation speed of the integrated circuit.

SUMMARY OF THE INVENTION

Taking above situation into consideration a first object of this invention is to provide a semiconductor device which is very small and also has higher performance.

A second object of this invention is to provide a method for manufacturing this semiconductor device.

The first object can be attained by a semiconductor device comprising a semiconductor body; a first semiconductor region of a first conductivity type formed in the main surface area of the semiconductor substrate; a first insulation film formed on the main surface of the semiconductor substrate; a conductive layer formed on part of the insulation film which lies on the first semiconductor region; a second insulation film formed on the conductive layer; a through hole formed to pass through the second insulation film, conductive layer and first insulation film and reach the first semiconductor region; a second semiconductor region formed on part of the first semiconductor region which lies inside the through hole; and a third semiconductor region of the first conductivity type formed on the second semiconductor region inside the through hole; wherein an amount of carriers moving in the second semiconductor region in a direction perpendicular to the main surface of the semiconductor substrate is controlled by an applied voltage of conductive layer.

According to the above construction, the first semiconductor region serves as a source or drain region, the second semiconductor region serves as a channel region, the third semiconductor region acts as a drain or source region, and the conductive layer acts as a gate electrode. Since the channel region is surrounded by the gate electrode, the current controllability of the gate voltage and the performance such as the switching speed can be raised up. Furthermore, since the active region of the FET is formed in a direction perpendicular to the main surface of the semiconductor substrate, the occupied area size of the semiconductor substrate of the FET can be reduced and the integration density can be raised up.

The second object can be attained by a method for manufacturing a semiconductor device, comprising the steps of forming a first semiconductor region of a first conductivity type containing impurity with a high impurity concentration in the main surface area of a semiconductor substrate; forming a first insulation film on the main surface of the semiconductor substrate; forming a conductive layer on the insulation film; forming a second insulation film on the conductive layer and first insulation film; forming a through hole to pass through the second insulation film, conductive layer and first insulation film and reach the first semiconductor region; forming a second semiconductor region on part of the first semiconductor region which lies inside the through hole; and forming a third semiconductor region of the first conductivity type formed on the second semiconductor region inside the through hole.

According to the above manufacturing method, since the gate length can be determined by the film thickness of the conductive layer, the gate length controllability can be set with high precision. Since the channel region is surrounded by the gate electrode, the higher current controllability of the gate voltage which results in high switching speed performance can be obtained. Furthermore, since the source region, channel region and drain region of the FET are stacked on the main surface of the semiconductor substrate vertically, the occupied area of the FET can be reduced and the integration density can be raised up. Furthermore, if the second semiconductor region is formed with using the selective epitaxial growth, the impurity concentration gradient in the junction region between the source region and the channel region and that in the junction region between the channel region and the drain region can be adequately formed by controlling an amount of impurity gas contained in resource gases, that is, the mixing ratio, and thus the high performance can be attained.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE PREFERRED EMBODIMENTS

There will now be described a semiconductor device and a method for manufacturing the same according to a first embodiment of this invention with reference to FIGS. 1 to 12.

Figure 1:
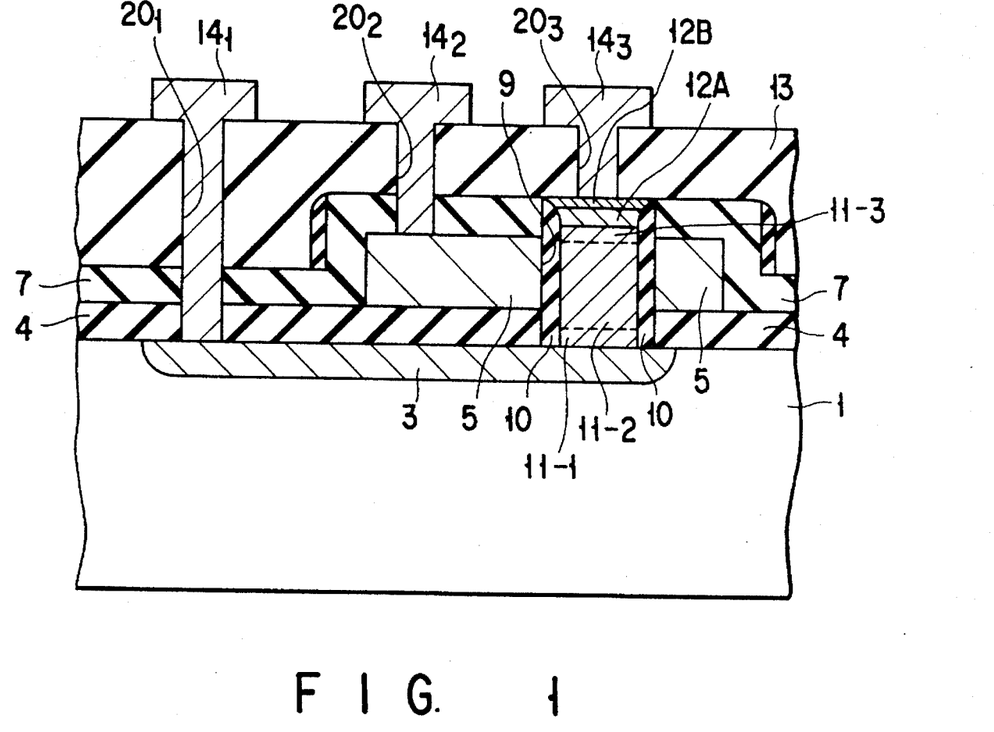
FIG. 1 is a cross sectional view of an MISFET for illustrating a semiconductor device according to a first embodiment of this invention.
Figure 4:
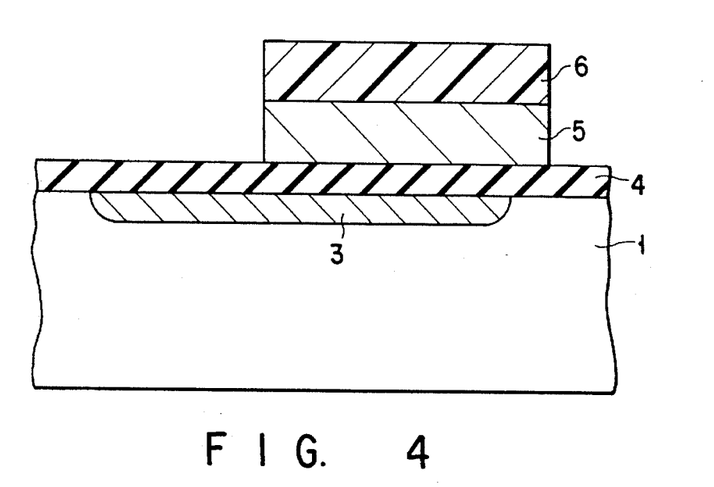
Figure 5:
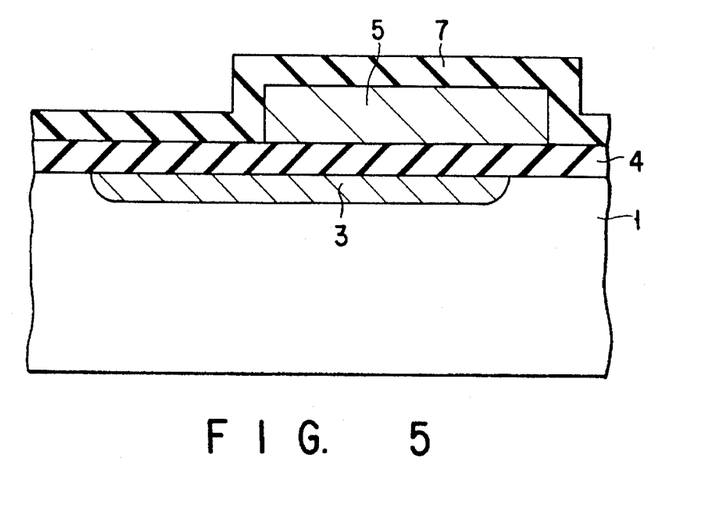
Figure 6:
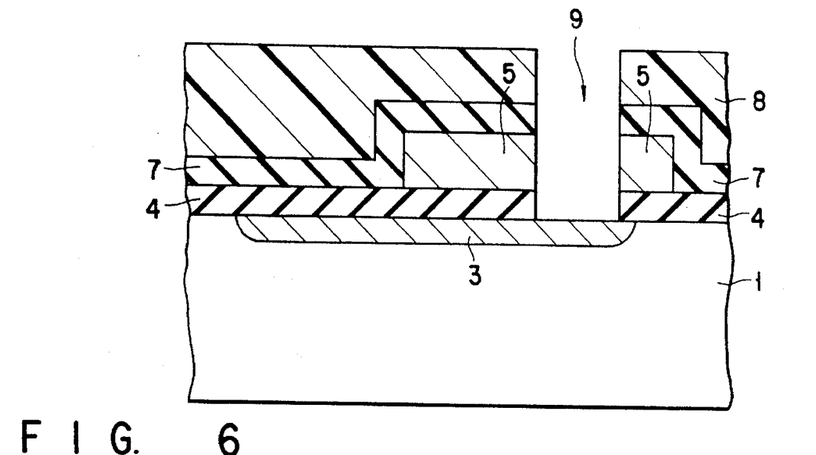
Figure 10:
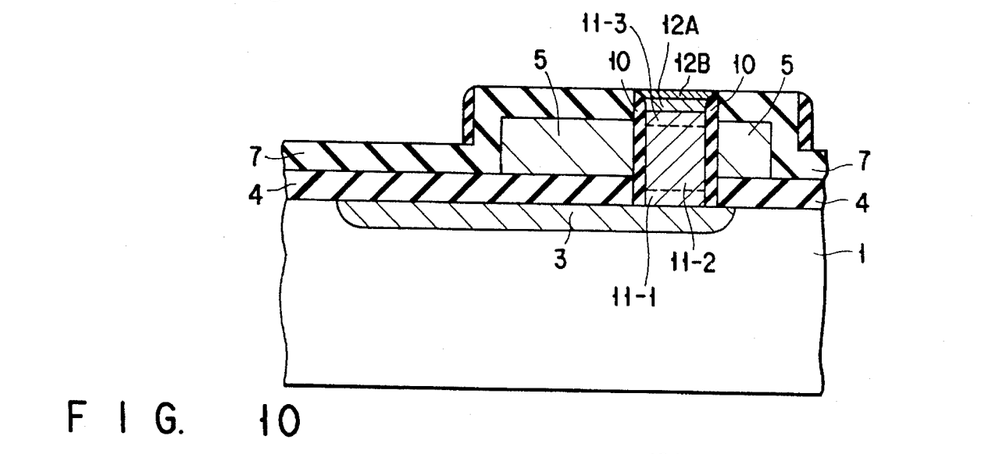
Figure 11:
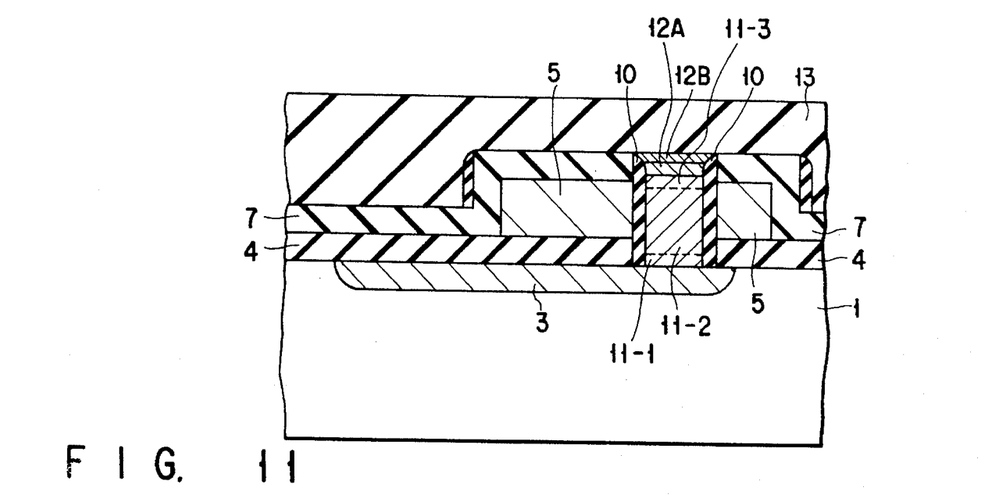
Figures 12, 13:
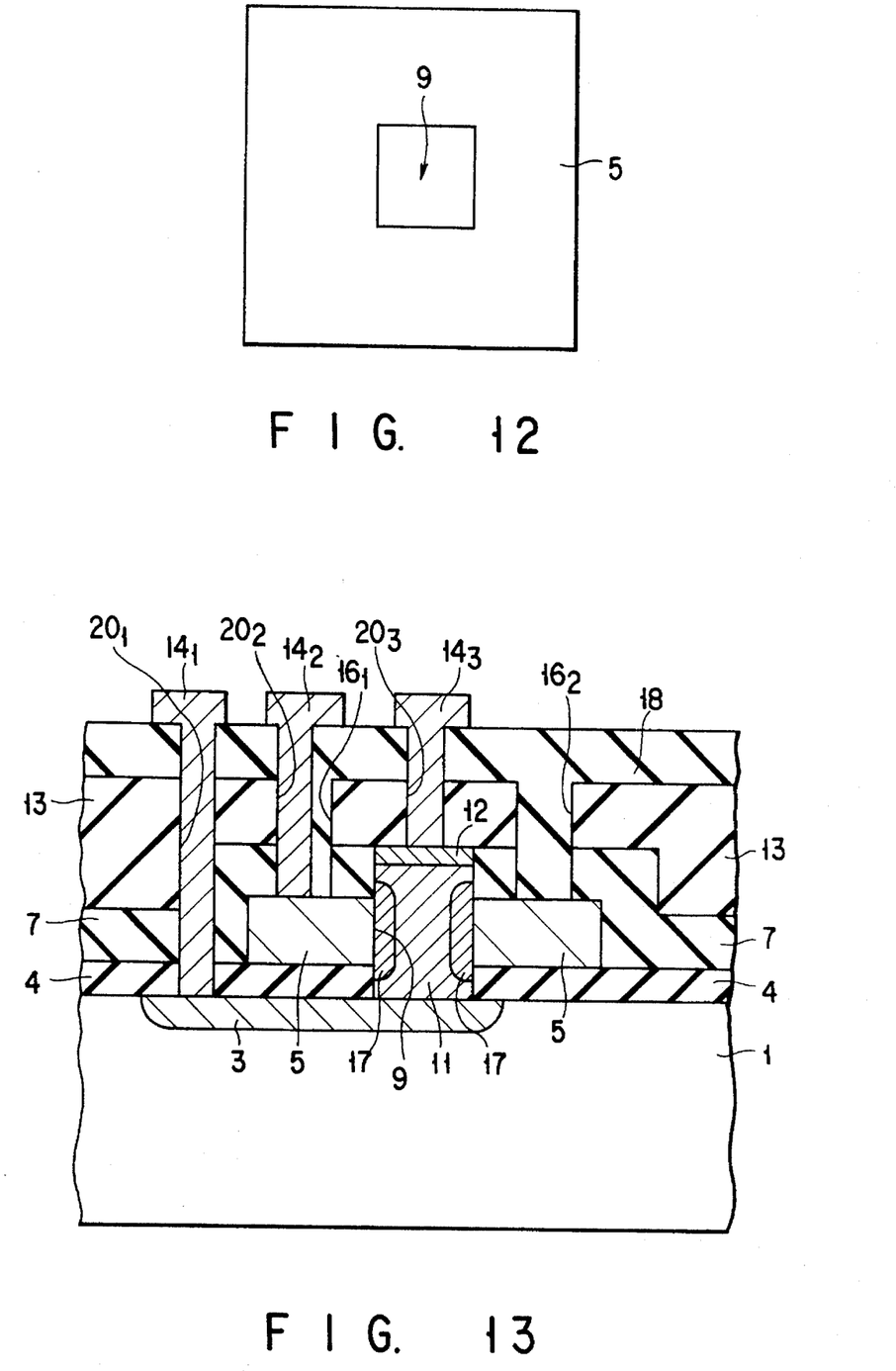
FIG. 12 is a pattern plan view schematically showing a gate electrode and a through hole in the semiconductor structure in the step of FIG. 6.
FIG. 13 is a cross sectional view of a JFET for illustrating a semiconductor device according to a second embodiment of this invention.

FIG. 1 is a cross sectional view showing the construction of a MISFET according to a first embodiment of this invention, FIGS. 2 to 11 are cross sectional views showing the semiconductor structures of the MISFET of FIG. 1 obtained in the respective main manufacturing steps, and FIG. 12 is a pattern plan view showing a gate electrode and a through hole in the semiconductor structure in the step of FIG. 6.

As shown in FIG. 1, an N-type impurity diffusion region (which is a source region or drain region, but it is hereinafter treated as a source region) 3 is formed in the main surface area of a P-type silicon substrate 1. An insulation film 4 is formed on the main surface of the substrate 1 and a gate electrode 5 is formed on part of the insulation film which lies on the source region 3. An insulation film 7 is formed on the gate electrode 5 and the insulation film 4. A through hole 9 is formed in portions of the insulation film 7, gate electrode 5 and insulation film 4 which lie on part of the source region 3 and a gate oxide film 10 is formed on the side wall of the through hole 9. A silicon layer 11 serving as a channel region is filled inside the through hole 9. An N-type drain region 12A (or it may be a source region, but it is hereinafter treated as a drain region) and a contact region 12B are formed on the upper portion of the silicon layer 11. An insulation film 13 is formed on the resultant structure. A contact hole $20_1$ is formed in portions of the insulation films 13, 7 and 4 which lie on part of the source region 3 and a source wiring layer $14_1$ is formed inside the contact hole $20_1$ and on that portion of the insulation film 13 which surrounds the contact hole. A contact hole $20_2$ is formed in portions of the insulation films 13 and 7 which lie on part of the gate electrode 5 and a gate wiring layer $14_2$ is formed inside the contact hole $20_2$ and on that portion of the insulation film 13 which surrounds the contact hole. Furthermore, a contact hole $20_3$ is formed in a portion of the insulation film 13 which lies on part of the contact area 12B and a drain wiring layer $14_3$ is formed inside the contact hole $20_3$ and on that portion of the insulation film 13 which surrounds the contact hole.

The impurity concentration of the silicon layer 11 serving as a channel region is made high in a portion 11-1 near the junction between the silicon layer 11 and the source region 3 and in a portion 11-3 near the junction between the silicon layer 11 and the drain region 12A and is made low in a central portion 11-2.

The operation principle of the MISFET with the above construction is basically the same as that of a normal MISFET having source and drain regions and a channel region formed in the semiconductor substrate. That is, a bias voltage is applied to the gate electrode 5 to induce carriers having the same conductivity type as the source and drain regions in the channel region 11 so as to form a channel and permit a current to flow between the source and drain regions 3 and 12A. At this time, the amount of current flowing through the channel is controlled according to the level of the bias voltage.

With the above structure, since the channel region 11 is surrounded by the gate electrode 5, the drain current controllability of the gate voltage can be further enhanced in comparison with a case of the conventional MISFET having a channel region in the semiconductor substrate. When the channel is formed by application of the gate voltage, the silicon layer 11 is depleted at it's center portion. In this state, since the FET becomes substantially the same as an FET having so-called SOI (Silicon On Insulator) structure in which a MISFET is formed in a thin semiconductor film formed on an insulation film, the carrier mobility is increased and a large drain current can be obtained. Furthermore, since the channel region 11 and drain region 12A are laminated and formed in a 3-dimensional manner on the source region 3, that is, they are laminated in a direction perpendicular to the main surface of the substrate 1, the size of the FET on a plane can be reduced and therefore the integration density can be raised up.

Figure 2:
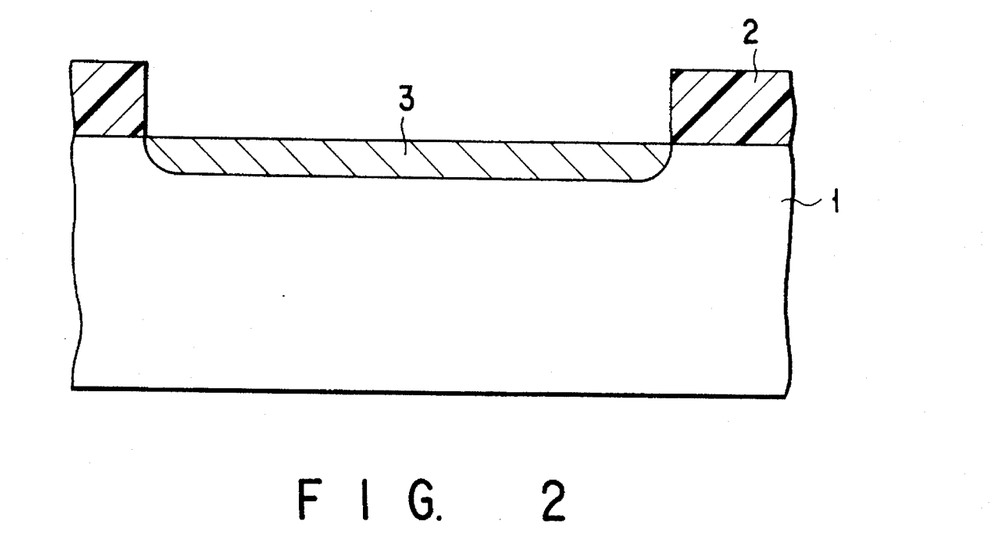
FIGS. 2 to 11 are cross sectional views showing the semiconductor structures of the MISFET of FIG. 1 obtained in the respective manufacturing steps for illustrating a method for manufacturing the semiconductor device according to the first embodiment of this invention.

The FET shown in FIG. 1 is formed according to the following manufacturing steps. First, as shown in FIG. 2, a mask 2 is formed on a P-type silicon substrate (plane orientation (100)) with resistivity of 4 to 6Ω·cm by use of a photoresist and an N-type impurity such as arsenic is ion-implanted. After this, the mask 2 is removed and the ion-implanted impurity is subjected to the activation annealing process at temperatures of approximately 900° C. to form an N-type impurity diffusion region (source region) 3.

Figure 3:
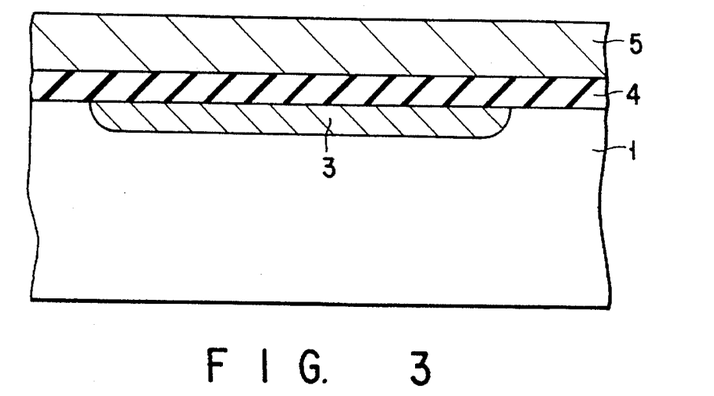

Next, as shown in FIG. 3, an insulation film 4 such as a silicon oxide film and a polysilicon layer 5 which is used to form the gate electrode of the MISFET are sequentially formed on the substrate 1 by use of the chemical vapor deposition method (CVD). Then, in order to reduce the resistance of the polysilicon layer 5, an N-type impurity such as phosphorus is doped into the polysilicon layer 5 by use of the ion-implantation or thermal diffusion. At this time, metal can be used instead of polysilicon as a material of the gate electrode. In this case, it is preferable to use metal such as molybdenum or tungsten having a sufficiently high melting point when taking the succeeding heat treatment step into consideration.

Next, as shown in FIG. 4, a mask 6 is formed by use of a photoresist and the polysilicon layer 5 is patterned by use of the reactive ion etching (RIE) method to form a gate electrode.

After the mask 6 is removed, an insulation film 7 such as a silicon oxide film is formed on the insulation film 4 and gate electrode 5 by use of the CVD method as shown in FIG. 5.

As shown in FIG. 6, after a mask 8 is formed by use of a photoresist, a through hole 9 passing through the insulation film 7, gate electrode 5 and insulation film 4 and reaching the impurity diffusion region 3 is formed by use of the RIE method. At this time, the shape obtained when viewing the substrate 1 from the above becomes a plane pattern in which the through hole 9 is formed in the gate electrode 5 as shown in FIG. 12.

Figure 7:
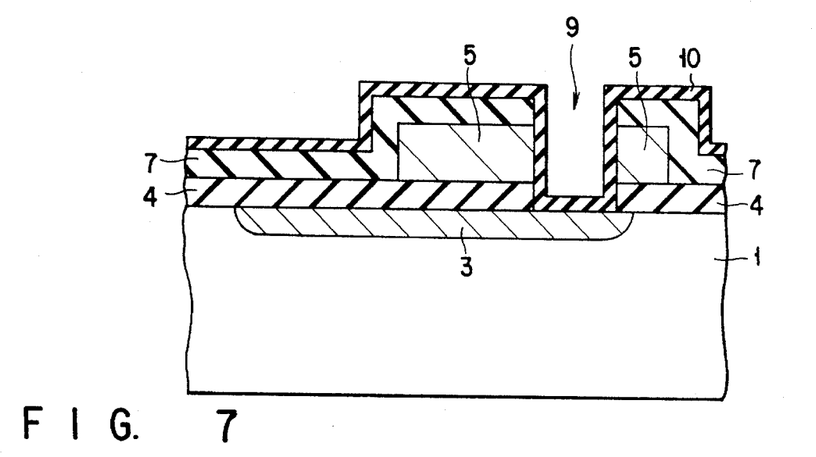

Then, as shown in FIG. 7, an insulation film 10 such as a silicon oxide film is formed to a thickness of several hundreds Å as the gate insulation film of the MISFET on the insulation film 7, side wall of the through hole 9 and the exposed surface of the impurity diffusion region 3. At this time, a silicon nitride film may be formed as the insulation film 10 instead of the silicon oxide film. The insulation film 10 may be formed by oxidizing the polysilicon layer (gate electrode) 5 exposed to the side wall of the through hole 9 in an oxygen atmosphere of high temperature instead of effecting the CVD process.

Figure 8:
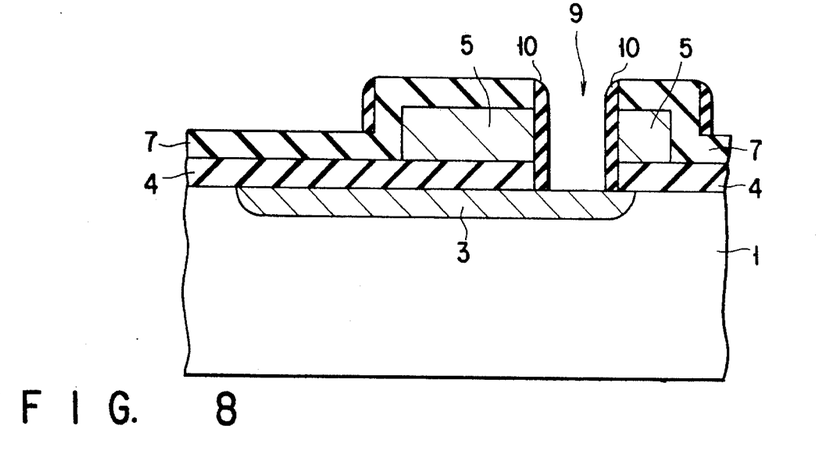

Next, as shown in FIG. 8, part of the insulation film 10 which lies on the insulation film 7 and impurity diffusion region 3 is removed by etching back the insulation film 10 by use of the RIE method. At this time, the insulation film 10 is partly left behind on the stepped portion of the insulation film 7 and the side wall of the through hole 9. Part of the insulation film 10 which lies on the side wall of the through hole 9 serves as a gate insulation film.

Figure 9:
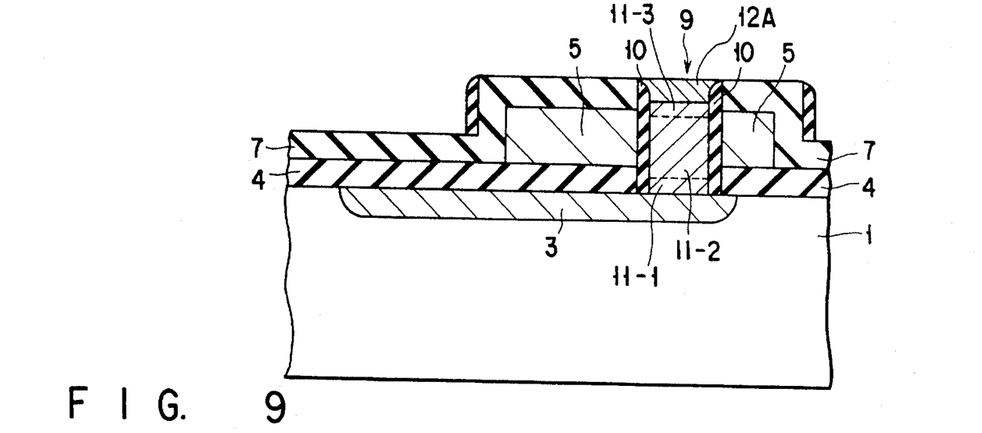

After this, as shown in FIG. 9, silicon is grown on the exposed surface of the impurity diffusion region 3 in the through hole 9 by use of the selective epitaxial technique for growing silicon only on the silicon lattices. Thus, silicon is formed to fill the through hole 9 so as to form the channel region 11 and drain region 12A of the MISFET. The amount of impurity gas in the reactive gases, that is, the mixing ratio of the impurity is so controlled that the impurity concentration of the channel region 11 may be made low in the central portion 11-2 and high in the both end portions 11-1 and 11-3. It is well known in the art that the characteristic of the MISFET is largely dependent on the impurity concentration gradient in the junction between the source region and the channel region and in the junction between the channel region and the drain region and the threshold voltage of the MISFET is generally controlled by the impurity concentration of the channel region. In the above-described manufacturing method, the operation of doping the impurity into the channel region 11 and drain region (or source region) 12A is effected by introducing a gas containing the impurity, which may for example be boron, when the through hole 9 is filled with silicon by use of the selective epitaxial technique. The impurity concentration can be easily and precisely controlled by changing the amount of impurity contained in the reactive gas. Furthermore, with the above method, the impurity concentration gradient of the portion 11-1 near the junction between the impurity diffusion region 3 and the silicon layer 11 and that of the portion 11-3 near the junction between the silicon layer 11 and the drain region 12A which give a large influence on the characteristic of the MISFET can be precisely controlled by changing the mixing ratio of the impurity contained in the reactive gas according to the thickness of the silicon film to be deposited.

In certain preferred embodiments of the present invention, the conductivity type of the channel region 11 is chosen to be opposite to that of the N-type source or drain region 3. In other preferred embodiments, the conductivity type of the channel region 11 is chosen to be the same as that of the N-type source or drain region 3. For either of these doping types, the dopant concentration is preferably chosen to be highest in the regions 11-1 and 11-3 adjacent to the N-type region 3 and the N-type region 12A. A lower doping concentration is chosen for the central region 11-2.

Next, as shown in FIG. 10, an N-type impurity is ion-implanted into the drain region 12A by use of a low acceleration voltage and subjected to the activation annealing process to form an N-type contact region 12B. The contact region 12B is formed with high impurity concentration so as to attain a good ohmic contact with a metal wiring layer such as an aluminum wiring layer.

Next, as shown in FIG. 11, an insulation film 13 such as a silicon oxide film used to form an inter-level insulation film is formed on the insulation film 7 by use of the CVD method.

After this, contact holes $20_1$, $20_2$ and $20_3$ are respectively formed in portions of the insulation films 13, 7, 4 lying on part of the impurity diffusion region 3, in portions of the insulation films 13, 7 lying on part of the gate electrode 5, and in a portion of the insulation film 13 lying on part of the contact region 12B by use of the RIE method. Then, metal such as aluminum whose resistivity is small is vapor deposited and patterned to form a source wiring layer $14_1$, gate wiring layer 142 and drain wiring layer $14_3$. As a result, the MISFET with the structure shown in FIG. 1 is completed.

According to the above manufacturing method, the gate length can be determined by the film thickness of the gate electrode 5, easily controlled and set to a desired value with high precision. Further, the impurity concentration gradients in the portions near the junction between the source region 3 and the channel region 11 and the junction between the channel region 11 and the drain region 12A can be easily controlled with high precision by controlling the amount of impurity gas contained in the reactive gases at the time of selective growth, thereby making it possible to provide a MISFET with high switching speed.

Next, a semiconductor device and a method for manufacturing the same are explained with reference to FIGS. 13 to 19. FIG. 13 is a cross sectional view of a J (Junction) FET according to a second embodiment of this invention, and FIGS. 14 to 19 are cross sectional views sequentially showing the semiconductor structures of the JFET according to the second embodiment of this invention and obtained in the respective main manufacturing steps.

As shown in FIG. 13, an N-type impurity diffusion region (which is a source region or drain region, but is hereinafter treated as a source region) 3 is formed in the main surface area of a P-type silicon substrate 1. An insulation film 4 is formed on the main surface of the substrate 1 and a gate electrode 5 is formed on part Of the insulation film 4 which lies on the source region 3. An insulation film 7 is formed on the gate electrode 5 and the insulation film 4. A through hole 9 is formed in portions of the insulation film 7, gate electrode 5 and insulation film 4 which lie on part of the source region 3 and a silicon layer 11 serving as a channel region is filled inside the through hole 9. An N-type drain region 12 (or it may be a source region, but it is hereinafter treated as a drain region) is formed on the upper portion of the silicon layer 11. A P-type impurity diffusion layer 17 is formed in that portion of the silicon layer 11 which lies near the junction thereof with the gate electrode 5. An insulation film 13 is formed on the resultant structure. Through holes $16_1$, $16_2$ are formed in portions of the insulation films 13, 7 which lie on respective parts of the gate electrode 5, and an insulation film 18 is formed inside the through holes $16_1$, $16_2$ and on the insulation film 13. The through holes $16_1$, $16_2$ are used to introduce an impurity into the gate electrode 5 and form a P-type impurity diffusion layer 17 with the gate electrode used as a diffusion source. A contact hole $20_1$ is formed in portions of the insulation films 18, 13, 7 and 4 which lie on part of the source region 3, and a source wiring layer $14_1$ is formed inside the contact hole $20_1$ and on that portion of the insulation film 18 which surrounds the contact hole. A contact hole $20_2$ is formed in portions of the insulation films 18, 13 and 7 which lie on part of the gate electrode 5 and a gate wiring layer $14_2$ is formed inside the contact hole $20_2$ and on that portion of the insulation film 18 which surrounds the contact hole. Further, a contact hole $20_3$ is formed in portions of the insulation films 18 and 13 which lie on part of the drain region 12 and a drain wiring layer $14_3$ is formed inside the contact hole $20_3$ and on that portion of the insulation film 18 which surrounds the contact hole.

The operation principle of the JFET with the above structure is basically the same as that of a normal JFET and a reverse bias voltage is applied to the gate electrode 5 to change the width of the depletion layer in the PN junction portion created by the impurity diffusion layer 17 and the channel region 11 so as to change the channel width, thereby making it possible to control the drain current.

With the above structure, since the channel region 11 is surrounded by the gate electrode 5 like the first embodiment, the drain current controllability of the gate voltage is high. Furthermore, since the active regions of the FET are stacked on the main surface of the substrate 1 vertically, a high performance FET in which the gate length can be precisely controlled and the switching speed is high can be obtained.

Figure 14:
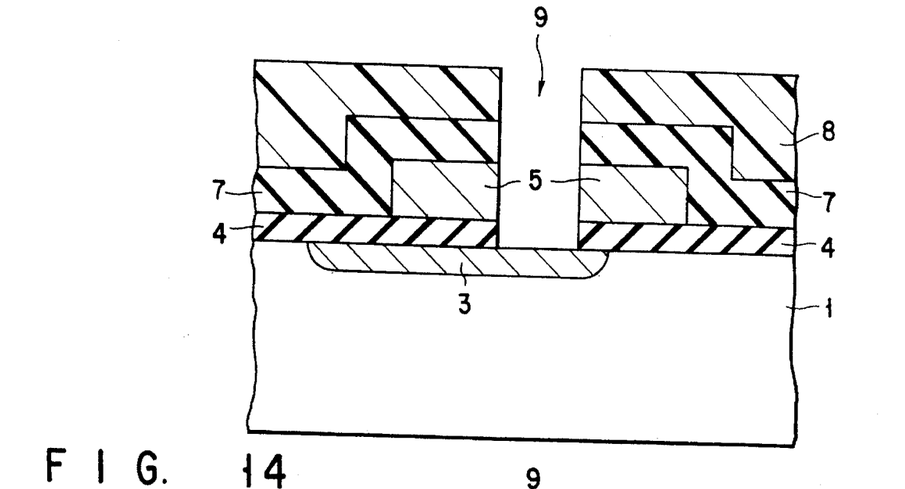
FIGS. 14 to 19 are cross sectional views showing the semiconductor structures of the JFET of FIG. 13 obtained in the respective manufacturing steps for illustrating a method for manufacturing the semiconductor device according to the second embodiment of this invention.

The FET shown in FIG. 13 is formed according to the following manufacturing steps. First, a structure shown in FIG. 14 is obtained by effecting the same steps as the steps shown in FIGS. 2 to 6. At this time, molybdenum or tungsten is used as a material of the gate electrode 5.

Figure 15:
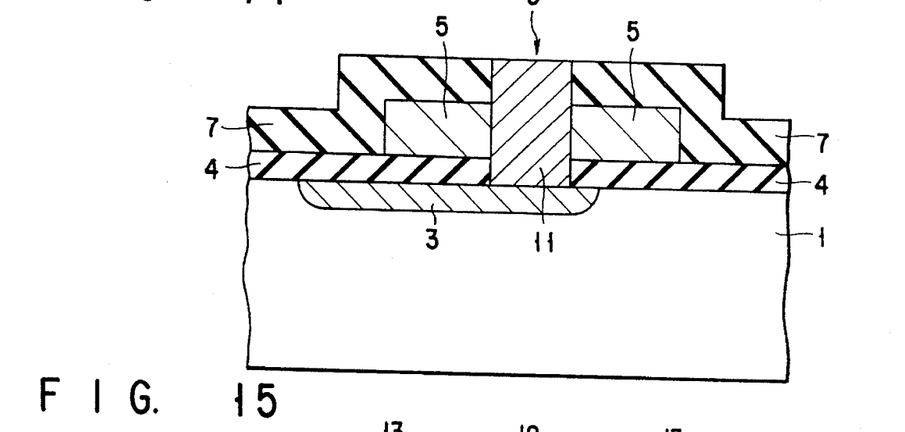

After removing a mask 8, silicon is grown on the exposed impurity diffusion region 3 by use of the selective epitaxial method as shown in FIG. 15 to fill the through hole 9 with silicon so as to form a channel region 11. At this time, an impurity of the same conductivity type as that of the impurity diffusion region 3 is doped into the silicon layer filled into the through hole at a lower impurity concentration than that of the impurity diffusion region 3 to form an N-type silicon layer of low impurity concentration.

Figure 16:
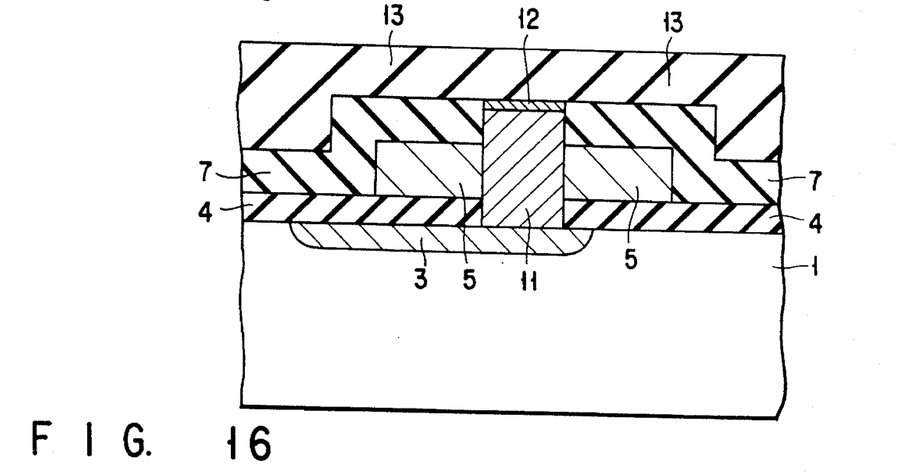

Next, as shown in FIG. 16, an N-type impurity is doped into the upper portion of the filled silicon layer 11 and subjected to the activation annealing process to form a drain region 12. Then, an insulation film 13 such as a silicon oxide film is formed by deposition as an inter-level insulation film on the resultant structure.

Figure 17:
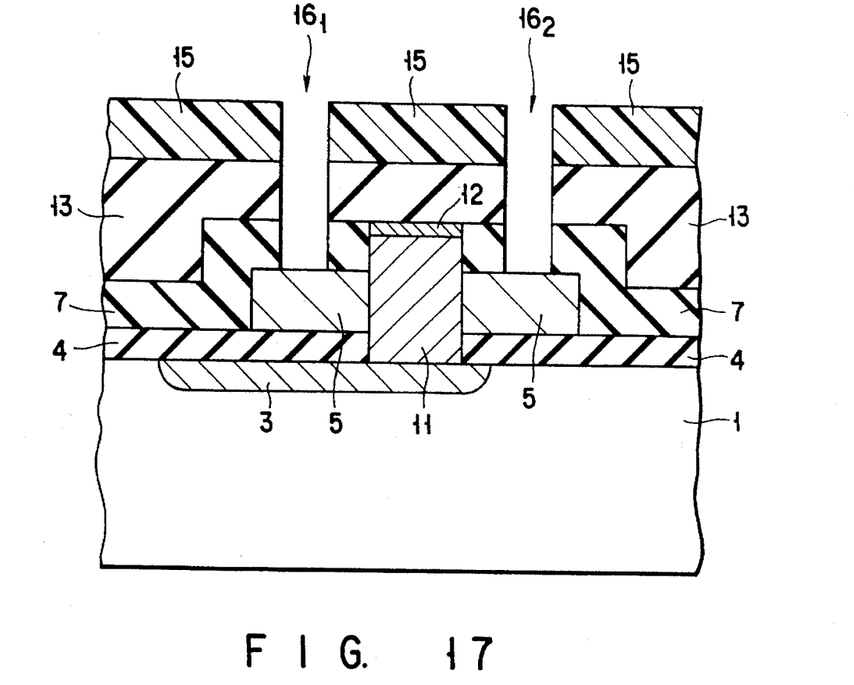

After this, as shown in FIG. 17, a mask 15 is formed by use of a photoresist, and then through holes $16_1$, $16_2$ are formed in the insulation films 13, 7 to reach the gate electrode 5, and a P-type impurity such as boron is ion-implanted into the gate electrode 5 via the through holes $16_1$, $16_2$.

Figure 18:
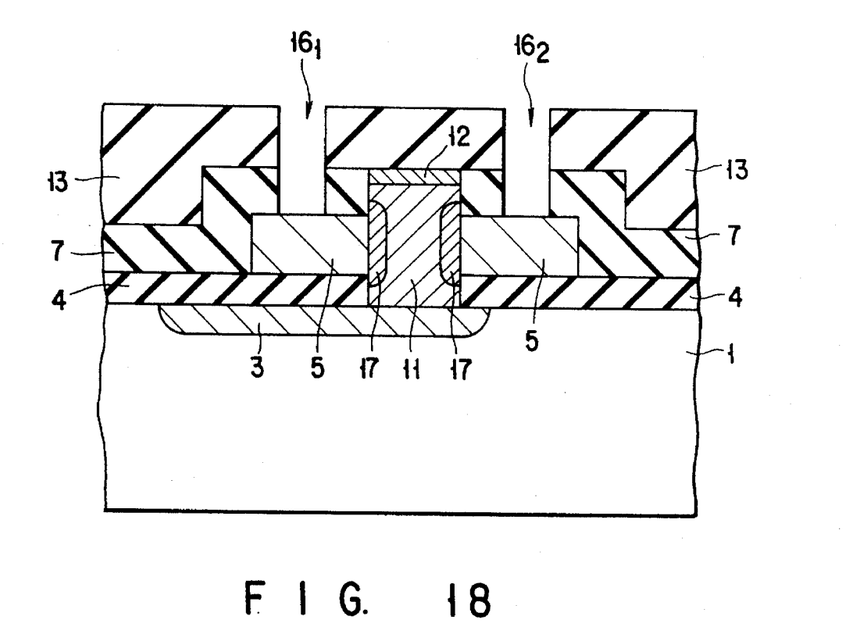

As shown in FIG. 18, after the mask 15 is removed, the ion-implanted impurity is annealed at a temperature of approximately 900° C. so as to be diffused. It is well known in the art that the diffusion speed of the impurity in molybdenum and tungsten is high, and the P-type impurity ion-implanted into the gate electrode 5 is diffused in the gate electrode 5 by the annealing process and reaches the channel region 11, and passes into the channel region 11. As a result, a P-type impurity diffusion layer 17 is formed in a portion of the channel region 11 which lies near the junction between the channel region and the gate electrode 5 by diffusion of the impurity.

Figure 19:
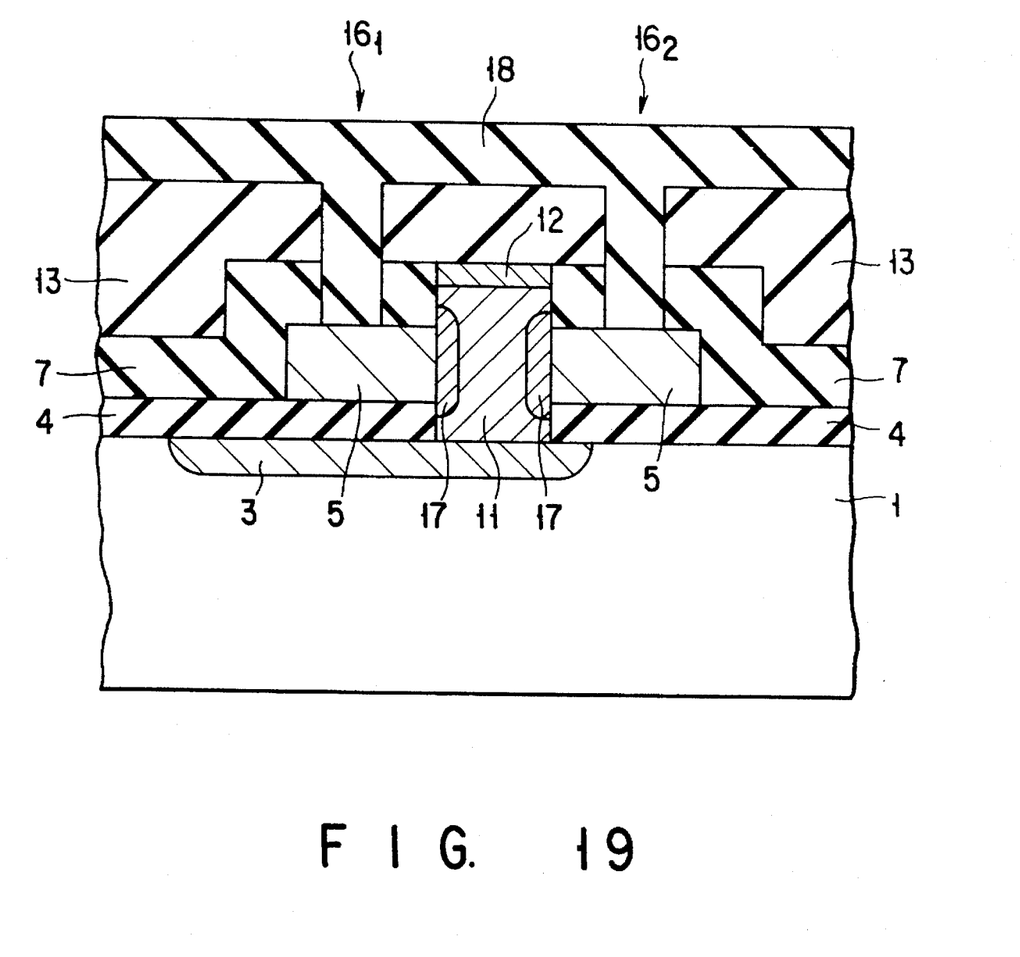

Then, as shown in FIG. 19, an insulation film 18 such as a silicon oxide film is formed by deposition inside the through holes $16_1$, $16_2$ and on the insulation film 13 by use of the CVD method. As a result, the through holes $16_1$, $16_2$ are filled with the insulation film 18.

Next, contact holes $20_1$ to $20_3$ are respectively formed in portions of the insulation films 18, 13, 7 and 4 which lie on part of the source region 3, in portions of the insulation films 18, 13 and 7 which lie on part of the gate electrode 5 and in portions of the insulation films 18 and 13 which lie on part of the drain region 12 by use of the RIE method. A metal layer such as an aluminum layer having a low resistance is formed on the insulation film 18 and inside the contact holes $20_1$ to $20_3$. The metal layer is patterned to form a source wiring layer $14_1$ inside the contact hole $20_1$ and on that portion of the insulation film 18 which surrounds the contact hole, a gate wiring layer $14_2$ inside the contact hole $20_2$ and on that portion of the insulation film 18 which surrounds the contact hole and a drain wiring layer $14_3$ inside the contact hole $20_3$ and on that portion of the insulation film 18 which surrounds the contact hole. Thus, the JFET shown in FIG. 13 is completed.

According to the above manufacturing method, the gate length can be determined by the film thickness of the gate electrode 5, easily controlled and set to a desired length with high precision. Furthermore, the impurity concentration and the impurity concentration gradient in the channel region 11 can be easily controlled with high precision by controlling the amount of impurity gas contained in the reactive gases at the time of selective growth, thereby making it possible to provide a JFET with high switching speed.

In the second embodiment, a case wherein a JFET is formed is explained as an example, but an SIT (State Induction Transistor) can be easily formed by reducing the film thickness of the gate electrode 5 to a sufficiently small value. That is, in the structure shown in FIG. 13, if the film thickness of the gate electrode 5 is reduced to a small thickness of several hundreds Å, the operation principle of the element is changed from the operation principle of a normal JFET that the drain current is controlled by changing the channel width according to the width of the depletion layer in the PN junction to the operation principle that a potential barrier is formed in the channel by application of a gate voltage and the drain current is controlled by the potential barrier. The element is called an SIT, exhibits a characteristic that the current-voltage characteristic is non-saturated and has an excellent characteristic as a large power discrete element.

Furthermore, in the second embodiment, when metal for forming a Schottky barrier in the contact portion thereof with the channel region 11 is used as a material of the gate electrode 5, for example, when a gate electrode 5 of platinum is used for N-type silicon, the Schottky junction itself has substantially the same characteristic as the PN junction so that the element may function as a so-called Schottky-gate FET (which is also called MESFET) even if the P-type impurity diffusion layer 17 is not formed by doping the impurity into the gate electrode 5.

Thus, various types of elements such as a MISFET, JFET, MESFET, SIT can be formed simply by changing the material and film thickness of the gate electrode 5, the conductivity type of the channel region 11, and means for insulation between the channel region 11 and the gate electrode 5.

In the first and second embodiments, various FETs having a semiconductor substrate formed of silicon are explained, but the material of the semiconductor substrate is not limited to silicon, other semiconductor material such as gallium arsenide can be used. Furthermore, in the first and second embodiments, the N-channel FET is explained as an example, but a P-channel FET which is operated by carriers of the opposite conductivity type can be obtained by changing the conductivity types of the source region 3 and drain region 12A, from N type to P type and changing the conductivity type of the channel region 11 from P type to N type or N type to P type. This invention can be variously modified without departing from the technical scope thereof.

Additional advantages and modifications will readily occur to those skilled in the art. Therefore, the invention in its broader aspects is not limited to the specific details, representative devices, and illustrated examples shown and described herein. Accordingly, various modifications may be made without departing from the spirit or scope of the general inventive concept as defined by the appended claims and their equivalents.

What is claimed is:

1. A method of manufacturing a semiconductor device, the method comprising:

forming a first semiconductor region of a first conductivity type in a main surface of a semiconductor substrate;

forming a first insulation film on said main surface of said semiconductor substrate;

forming a conductive layer on said first insulation film;

patterning said conductive layer to at least partially overlie said first semiconductor region;

forming a second insulation film on said conductive layer;

forming a first through hole to pass through said second insulation film, said conductive layer and said first insulation film to reach said first semiconductor region;

filling said first through hole with a semiconductor material of said first conductivity type to form a second semiconductor region of said first conductivity type on a part of said first semiconductor region inside said first through hole so that said second semiconductor region has an impurity concentration lower than that of said first semiconductor region;

forming a third semiconductor region of said first conductivity type on said second semiconductor region;

forming a second through hole to pass through said second insulation film to reach said conductive layer;

doping impurities of said second conductivity type into said conductive layer through said second through hole; and heating to diffuse said impurities of said second conductivity type into said second semiconductor region to form a fourth semiconductor region of said second conductivity type in said second semiconductor region, wherein said fourth semiconductor region is adjacent to said conductive layer.

2. The method of claim 1, wherein said filling said first through hole with said semiconductor material of said first conductivity type includes growing said semiconductor material of said first conductivity type using selective epitaxial growth with said part of said first semiconductor region inside said first through hole used as a seed crystal for said selective epitaxial growth.

3. The method of claim 2, wherein said filling said first through hole with said semiconductor material of said first conductivity type includes changing a concentration of an amount of an impurity bas, in reactive gases used in said growing said semiconductor material of said first conductivity type using selective epitaxial growth, in accordance with a target thickness of said second semiconductor region, during said selective epitaxial growth.

4. The method of claim 1, wherein said semiconductor substrate includes a material selected from the group consisting of silicon of said second conductivity type and gallium arsenide, and said conductive layer includes a material selected from the group consisting of molybdenum and tungsten.

5. The method of claim 4, wherein said doping impurities of said second conductivity type into said conductive layer through said second through hole includes ion-implanting said impurities of said second conductivity type, and said heating to diffuse said impurities of said second conductivity type includes annealing at a temperature of about 900° C.

6. The method of claim 1, wherein said forming said first through hole and said forming said second through hole each include reactive ion etching.

7. The method of claim 1, wherein said forming said conductive layer includes forming said conductive layer to a thickness of about several hundreds of angstroms so that said semiconductor device operates as a state induction transistor.

8. A method of manufacturing a semiconductor device, the method comprising:

forming a first semiconductor region of a first conductivity type in a main surface of a semiconductor substrate;

forming a first insulation film on said main surface of said semiconductor substrate;

forming a conductive layer on said first insulation film;

patterning said conductive layer to at least partially overlie said first semiconductor region;

forming a second insulation film on said conductive layer;

forming a first through hole to pass through said second insulation film, said conductive layer and said first insulation film to reach said first semiconductor region;

filling said first through hole with a semiconductor material of said first conductivity type to form a second semiconductor region of said first conductivity type on a part of said first semiconductor region inside said first through hole so that said second semiconductor region has an impurity concentration lower than that Of said first semiconductor region;

forming a third semiconductor region of said first conductivity type on said second semiconductor region:

forming a second through hole to pass through said second insulation film to reach said conductive layer;

doping impurities of a said second conductivity type into said conductive layer through said second through hole; and heating to diffuse said impurities of said second conductivity type into said second semiconductor region to form a fourth semiconductor region of said second conductivity type in said second semiconductor region, wherein said fourth semiconductor region is adjacent to said conductive layer and wherein said first conductivity type is N-type, said second conductivity type is P-type, and said impurities of said second conductivity type are boron atoms.

9. The method of claim 8, wherein said filling said first through hole with said semiconductor material of said first conductivity type includes growing said semiconductor material of said first conductivity type using selective epitaxial growth with said part of said first semiconductor region inside said first through hole used as a seed crystal for said selective epitaxial growth.

10. The method of claim 9, wherein said filling said first through hole with said semiconductor material of said first conductivity type includes changing a concentration of an amount of an impurity gas, in reactive gases used in said growing said semiconductor material of said first conductivity type using selective epitaxial growth, in accordance with a target thickness of said second semiconductor region, during said selective epitaxial growth.

11. The method of claim 8, wherein said semiconductor substrate includes a material selected from the group consisting of silicon of said second conductivity type and gallium arsenide, and said conductive layer includes a material selected from the group consisting of molybdenum and tungsten.

12. The method of claim 11, wherein said doping impurities of said second conductivity type into said conductive layer through said second through hole includes ion-implanting said impurities of said second conductivity type, and said heating to diffuse said impurities of said second conductivity type includes annealing at a temperature of about 900° C.

13. The method of claim 8, wherein said forming said first through hole and said forming said second through hole each include reactive ion etching.

14. A method of manufacturing a semiconductor device, the method comprising the steps of:

forming a first semiconductor region of a first conductivity type in a main surface area of a semiconductor substrate of a second conductivity type;

forming a first insulation film on said main surface of said semiconductor substrate;

forming a conductive layer on said first insulation film;

patterning said conductive layer to at least partially overlie said first semiconductor region;

forming a second insulation film on said conductive layer and said first insulation film;

forming a first through hole to pass through said second insulation film, said conductive layer and said first insulation film to reach said first semiconductor region;

filling said first through hole with a semiconductor material of said first conductivity type to form a second semiconductor region of said first conductivity type on a part of said first semiconductor region inside said first through hole so that said second semiconductor region has an impurity concentration lower than that of said first semiconductor region;

forming a third semiconductor region of said first conductivity type on said second semiconductor region inside said first through hole;

forming a second through hole to pass through said second insulation film and reach said conductive layer;

doping an impurity into said conductive layer via said second through hole; and heating to diffuse said impurity doped into said conductive layer so as to form an impurity diffusion layer of a second conductivity type in a part of said second semiconductor region near a junction between said conductive layer and said first through hole.

15. The method of claim 14, wherein said filling said first through hole with said semiconductor material of said first conductivity type includes growing said semiconductor material of said first conductivity type using selective epitaxial growth with said part of said first semiconductor region inside said first through hole used as a seed crystal for said selective epitaxial growth.

16. The method of claim 15, wherein said filling said first through hole with said semiconductor material of said first conductivity type includes changing a concentration of an amount of an impurity gas, in reactive gases used in said growing said semiconductor material of said first conductivity type using selective epitaxial growth, in accordance with a target thickness of said second semiconductor region, during said selective epitaxial growth.

17. The method of claim 14, wherein said semiconductor substrate of said second conductivity type includes a material selected from the group consisting of silicon and gallium arsenide, and said conductive layer includes a material selected from the group consisting of molybdenum and tungsten.

18. The method of claim 17, wherein said doping said impurity into said conductive layer via said second through hole includes ion-implanting said impurity into said conductive layer, and said heating to diffuse said impurity doped into said conductive layer includes annealing at a temperature of about 900° C.

19. The method of claim 14, wherein said forming said first through hole and said forming said second through hole each include reactive ion etching.

20. The method of claim 14, wherein said forming said conductive layer includes forming said conductive layer to a thickness of about several hundreds of angstroms so that said semiconductor device operates as a state induction transistor.

* * * * *